(12) United States Patent
Derflinger et al.

(10) Patent No.: US 7,851,075 B2
(45) Date of Patent: *Dec. 14, 2010

(54) WORK PIECE WITH A HARD FILM OF ALCR-CONTAINING MATERIAL, AND PROCESS FOR ITS PRODUCTION

(75) Inventors: Volker Derflinger, Feldkirch (AT); Andreas Reiter, Feldkirch (AT); Christoph Gey, Balzers (LI)

(73) Assignee: Oerlikon Trading AG, Trubbach, Trubbach (CH)

( * ) Notice: Subject to any disclaimer, the term of this patent is extended or adjusted under 35 U.S.C. 154(b) by 482 days.

This patent is subject to a terminal disclaimer.

(21) Appl. No.: 11/749,236

(22) Filed: May 16, 2007

(65) Prior Publication Data
US 2008/0131727 A1  Jun. 5, 2008

Related U.S. Application Data

(63) Continuation of application No. 10/825,504, filed on Apr. 15, 2004, now Pat. No. 7,226,670.

(60) Provisional application No. 60/465,995, filed on Apr. 28, 2003, provisional application No. 60/512,590, filed on Oct. 17, 2003.

(51) Int. Cl.
B32B 9/00 (2006.01)
(52) U.S. Cl. ............................ 428/697; 51/307; 51/309; 407/119; 428/408; 428/698; 428/699; 428/701; 428/702; 428/704
(58) Field of Classification Search ................... 51/307, 51/309; 428/697, 698, 699, 701, 702, 704, 428/408; 407/119
See application file for complete search history.

(56) References Cited

U.S. PATENT DOCUMENTS

| | | | |
|---|---|---|---|
| 4,842,710 A | 6/1989 | Freller et al. | |
| 5,192,578 A | 3/1993 | Ramm et al. | |
| 5,707,748 A | 1/1998 | Bergmann | |
| 5,830,531 A | 11/1998 | Bergmann | |
| 6,116,828 A | 9/2000 | Egawa et al. | |

(Continued)

FOREIGN PATENT DOCUMENTS

EP  0432090 B1  11/1990

(Continued)

OTHER PUBLICATIONS

F. Sanchette, A. Billard, C. Frantz, "Mechanically reinforced and corrosion-resistant sputtered amorphous aluminium alloy-coatings," Surface adn Coatings Technology 98 (1998), pp. 1162-1168.

(Continued)

*Primary Examiner*—Archene Turner
(74) *Attorney, Agent, or Firm*—Pearne & Gordon LLP

(57) ABSTRACT

A work piece or structural component is coated with a system of film layers at least one of which is composed of $(Al_y Cr_{1-y})X$, where $X=N$, C, B, CN, BN, CBN, NO, CO, BO, CNO, BNO or CBNO and $0.2 \leq y < 0.7$, with the composition within said film being either essentially constant or varying over the thickness of the film continually or in steps, as well as a process for producing it.

17 Claims, 3 Drawing Sheets

U.S. PATENT DOCUMENTS

| | | |
|---|---|---|
| 6,213,692 B1 | 4/2001 | Guehring et al. |
| 6,274,257 B1 | 8/2001 | Aharonov et al. |
| 6,586,122 B2 | 7/2003 | Ishikawa et al. |
| 6,790,543 B2 | 9/2004 | Kubota et al. |
| 6,811,899 B2 | 11/2004 | Inoue |
| 6,824,601 B2 | 11/2004 | Yamamoto et al. |
| 6,827,976 B2 | 12/2004 | Derflinger et al. |
| 6,919,288 B2 | 7/2005 | Yamamoto et al. |
| 7,144,547 B2 * | 12/2006 | Yamamoto et al. ............ 419/49 |
| 7,166,155 B2 | 1/2007 | Ishikawa |
| 7,186,324 B2 | 3/2007 | Yamamoto et al. |
| 2003/0035894 A1 | 2/2003 | Derflinger et al. |

FOREIGN PATENT DOCUMENTS

| | | |
|---|---|---|
| EP | 0870565 A2 | 4/1998 |
| EP | 1 186 681 A1 | 3/2002 |
| EP | 1245699 A2 | 10/2002 |
| EP | 1422311 A2 | 5/2004 |
| EP | 1422311 A3 | 8/2004 |
| JP | 941127 A | 11/1976 |
| JP | 1025566 A | 1/1989 |
| JP | 03-207854 A | 9/1991 |
| JP | 09 041127 | 3/1995 |
| JP | 7164211 A | 6/1995 |
| JP | 9-41127 A | 2/1997 |
| JP | 10-25566 A | 1/1998 |
| JP | 10-337613 A | 12/1998 |
| JP | 11502775 A | 3/1999 |
| JP | 11-335813 A | 12/1999 |
| JP | 200-001768 A | 1/2000 |
| JP | 200-271699 A | 10/2000 |
| JP | 2002-307128 A | 10/2002 |
| JP | 2003-071610 | 3/2003 |
| JP | 2003-71610 A | 3/2003 |
| JP | 2003-071611 A | 3/2003 |
| JP | 2004-169076 A | 6/2004 |

OTHER PUBLICATIONS

J. Vetter, E. Lugscheider, S.S. Guerreiro, "(Cr:Al) N coatings deposited by the cathode vacuum arc evaporation," Surface and coatings Technology 98 (1998), pp. 1233-1239.

Clemens Kunisch, ronald Loos, Michael Stuber and Sven Ulrich, "Thermodynamic modeling of Al-Cr-N thin film systems grown by PVD," 1999, pp. 847-852.

Y. Ide, T. Nakamura and K. Kishitake, "Formation of Al-Cr-N. films by a DC reactive sputtering method and evaluation of their properties," 2000, pp. 291-296.

Thin fims (Proc. 4 in. Sympos. Trends & New Applications of Thin Films 1993) DGM Info Sges., Oberursel 1993, p. 73.

Surface & Coatings Technology vol. 165, 2 (2003) p. 163-167. Oxidation Resistance of Cr1-xA1xN and Ti1-xA1xN Films.

Surface & Coating Technology vol. 163-164 (2003) p. 57-61. High-Temperature Oxidation Resistance of cr1-xA1xN Thin Films Deposited by Reactive Magnetron Sputtering.

J. Vac. Sci. Technol. A 20(2), Mar./Apr. 2002, p. 569-571. Microhardness and Lattice Parameter of Cr1-xA1xN Films.

Surface & Coating technology, vol. 163-164 (2003) p. 546-551. Abrasive Wear Testing of DLC Coatings Deposited on Plane and Cylindrical Parts.

Tribologie-Fachtagung 2000, Moers: Ges. F. Tribol. 2002, ISBN 3-00-003404-8, Investigations of Mechanical and Tribological Properties of CrAlN + C Thin Coatings Deposited on Cutting Tools.

"Formation of Al-Cr-N Coatings by DC Reactive Sputtering", Yikio Ide, Katusuhiko Kishitake, and Takashi Nakamura, Japan Inst. Metals, vol. 63, No. 12 (1999), pp. 1576-1583.

"Phase transition of pseudobinary Cr-Al-N deposited by megnetron sputtering method" A. Sugishima, H. Kajioka, Y. Makino, Surface and Coatings Technology 97, (1997) 590-594.

* cited by examiner

Table 1

| Test Ref. | Al/Cr Ratio in Target | Crystal Structure | Al At% | Cr At% | Film Thickness [μm] | HV 0.03 | AV $[m^3m^{-1}N^{-1}10^{-15}]$ | Bond |
|---|---|---|---|---|---|---|---|---|
| A | 3 | B1 | 69.5 | 30.5 | 3.2 | 3100 | 0.8 | HF1 |
| B | 3 | B4 | 72 | 18 | 4.2 | 2100 | 1.0 | HF1 |
| C | 1 | B1 | 41.5 | 58.5 | 3.8 | 2800 | 1.5 | HF1 |
| D | 0.33 | B1 | 19 | 81 | 4.1 | 2300 | 2.5 | HF1 |

Table 2

| Test Ref. | Al/Cr Ratio In Target | $P_{Target}$ [kW] | $V_{substrate}$ [V] | P?? [Pa] | Temp [°C] |
|---|---|---|---|---|---|
| A | 3 | 3 | -50 | 3 | 450 |
| B | 3 | 3 | -50 | 1 | 450 |
| C | 1 | 3 | -50 | 3 | 450 |
| D | 0.33 | 3 | -50 | 3 | 450 |

Table 3

| Substrate Bias Voltage [V] | AV $[m^3m^{-1}N^{-1}10^{-15}]$ |
|---|---|
| 0 | 1.23 |
| -20 | 0.47 |
| -40 | 0.76 |
| -100 | 0.83 |
| -150 | 1.0 |
| -200 | 1.36 |

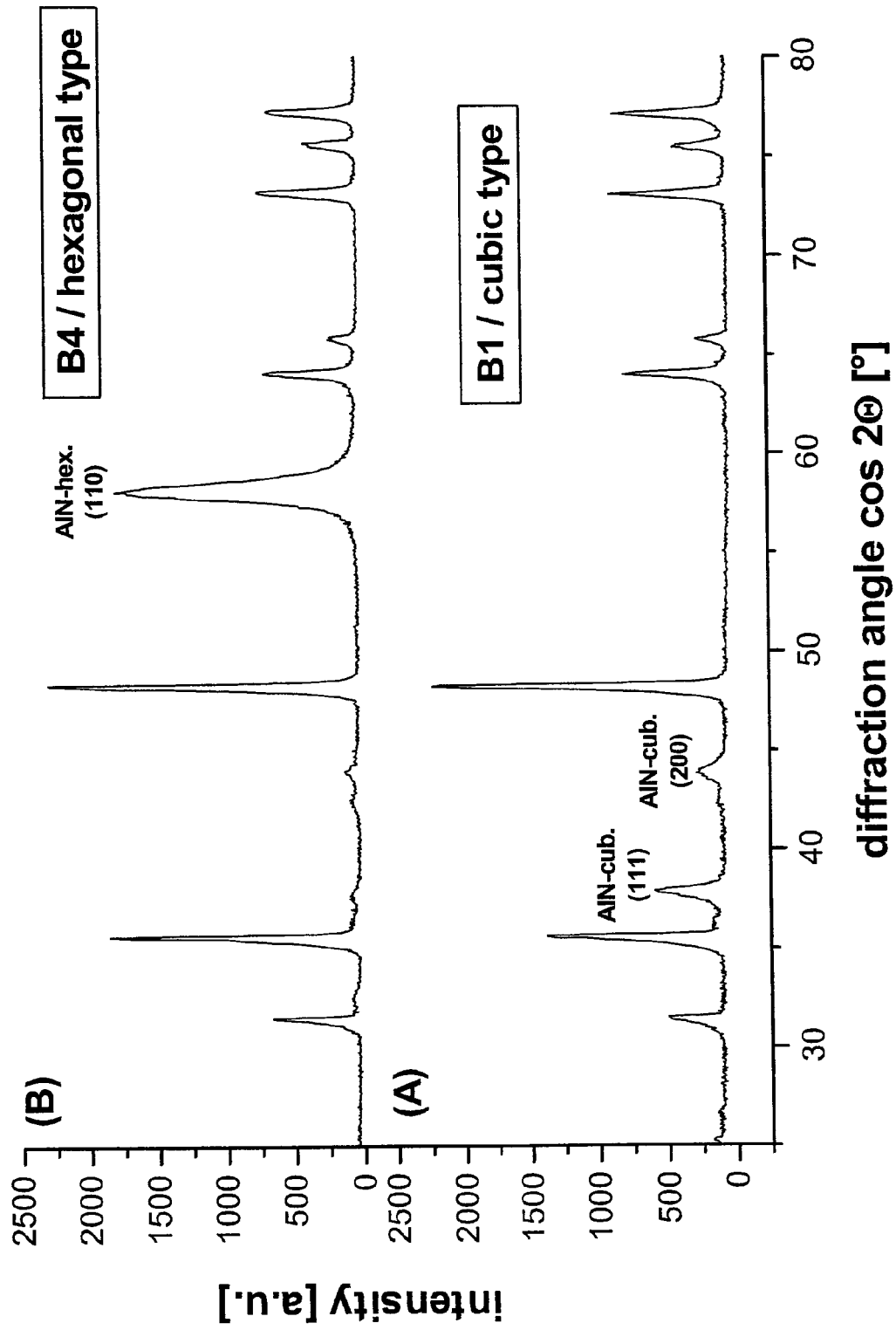
Fig 1 . X-Axis: diffraction angle cos (2 theta), unit: degrees

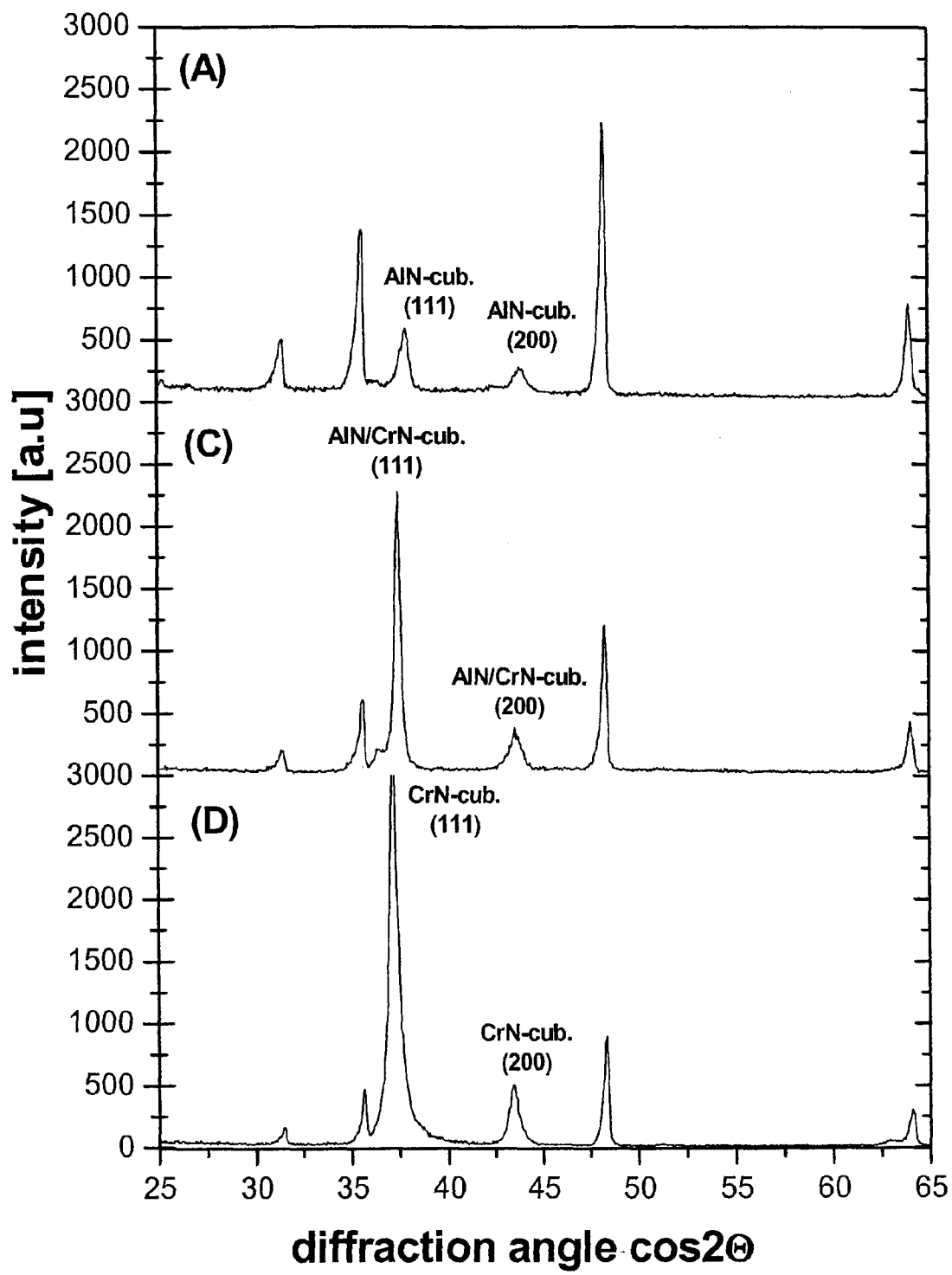
Fig. 2 - X-Axis: diffraction angle cos (2 theta), unit: degrees

WORK PIECE WITH A HARD FILM OF ALCR-CONTAINING MATERIAL, AND PROCESS FOR ITS PRODUCTION

This invention relates to the technology involving work pieces that are coated with a system of thin films including at least one layer of an $(Al_yCr_{1-y})X$ composition as specified in claims 1 and 2. The invention further relates to a PVD process for depositing at least one $(Al_yCr_{1-y})X$-film on a work piece as specified in claim 16.

Specifically, this invention encompasses the following:

Hard-material-coated work pieces with one or with a sequence of several different films of aluminum chrome nitride and/or carbonitride.

Tools coated with aluminum chrome nitride or carbonitride films, in particular cutting and machining tools (drills, routers, indexable inserts, screw taps, shapers, hobs, dies, swages, drawing punches etc.), and the use of such tools.

Components coated with AlCrN or AlCRCN films, in particular components in the realm of mechanical engineering/machine building, such as gears, pumps, cup rams, piston rings, injector needles, complete bearing assemblies or their individual components, and the use of such components.

A process for producing films of aluminum chrome nitride and/or carbonitride with a defined layer structure.

Various types of AlCrN films have been known in prior art. For example, JP 09-041127 describes a wear-resistant hard thin film of the following composition: $(Al_{1-y}X_y) Z$, where X=Cr, V or Mg, Z=N, C, B, CN, BN or CBN and $0<y\leq 0.3$. That film has been successfully used for extending the life of indexable inserts.

In "Multicomponent hard thin films . . . ", Thin Films (Proc. 4$^{th}$ Int. Sympos. Trends & New Applications of Thin Films, 1993), DGM Info.gesellschaft Oberursel, 1993, p. 73, D. Schulz and R. Wilberg describe a CrAlN film which according to a drill test doubles the life of a drill bit coated with TiAlN. The film was deposited by a hollow cathode process which, however, entails strong fluctuations in the chrome/aluminum distribution in the (CrAl)N layer due to a discontinuous evaporation pattern.

In "Oxidation resistance of $Cr_{1-x}Al_xN$ & $Ti_{1-x}Al_xN$ films", Surf. & Coat. Tech., Vol. 165, 2 (2003), p. 163-167, M. Kawate mentions a $Cr_{1-x}Al_xN$ film which, with a high Al content and a wurtzite structure, displays improved oxidation resistance in comparison with conventional TiAlN films.

In "Investigations of Mechanical & Tribol. Properties of CrAlN—C Thin Coatings Deposited on Cutting Tools", E. Lugscheider, K. Bobzin, K. Lackner compare arc-deposited CrAlN films with CrAlN coatings that have been additionally provided with an even harder, carbonaceous cover film. All of the layers display a coefficient of friction that rapidly rises to high levels.

It is the technical objective of this invention to introduce $(Al_yCr_{1-y})X$-coated work pieces such as chipping, metal-cutting and shaping tools and components used in machine and die construction, as well as a process for depositing such coatings on a work piece under avoidance of the drawbacks of prior-art methodology.

Examples include work pieces whose coating, at least in terms of the Al/Cr ratio, is of an adjustably uniform or selectably variable composition and which at least in certain applications offer greater wear resistance than has been obtainable with prior-art coatings.

To investigate the wear resistance of $(Al_yCr_{1-y})N$- or CN-coated tools, Cr films with different aluminum concentrations were deposited on a variety of work pieces, using an industrial RCS-type Balzers coating system as referred to for instance in EP 1186681, FIG. 3-6, description page 12, line 26, to page 14, line 9. By reference, said publication thus becomes an integral part of this patent application. For that purpose, the pre-cleaned work pieces were mounted, according to their diameter, either on double-rotating or, for diameters under 50 mm, on triple-rotating substrate carriers while two titanium and four powder-metallurgically produced targets of different AlCr alloys were installed in six cathode arc sources on the walls of the coating system. Next, radiant heaters likewise installed in the coating system heated the work pieces to a temperature of about 500° C. and, with a bias voltage of −100 to −200 V applied in an Argon atmosphere at a pressure of 0.2 Pa, the workpiece surfaces were subjected to etch-polishing with Ar ions.

Thereupon, by operating the two Ti sources at a power output of 3.5 kW (140 A) in a pure nitrogen atmosphere, a pressure of 3 Pa and a substrate voltage of −50V over a period of 5 minutes, a TiN bonding layer about 0.2 µm thick was deposited, followed by the activation of the four AlCr sources with a power of 3 kW for a period of 120 minutes, which deposited a film of AlCrN. An optimized transition between the layers was obtained by simultaneously operating all sources for 2 minutes. Thereafter, a nitride layer on an AlCr base was deposited in a pure nitrogen atmosphere, again at a pressure of 3 Pa and a substrate voltage of −50V. In principle, the process pressure for each of these steps may be set in the range from 0.5 to about 8 Pa, preferably between 2.5 and 5 Pa, and for nitride films either a pure nitrogen atmosphere or a mixture of nitrogen and an inert gas such as argon may be used, for carbonitride films a mixture of nitrogen and a carbonic gas, with the admixture of an inert gas if necessary. Correspondingly it is possible, when depositing oxygenous or boronic coatings, to admix oxygen or a boronic gas in conventional fashion.

Table 1 shows such characteristics of the layers as their crystallographic structure, their thickness, their hardness, their wear resistance and the bonding strength of AlCrN films as a function of their chemical composition and crystal structure as well as the composition of the targets employed.

Process parameters such as target yield, substrate bias voltage, process pressure and temperature are summarized in Table 2.

Table 3 reflects a test sequence in which AlCrN films were deposited using targets with an Al/Cr ratio equal to 3 and by applying different substrate voltages. The wear resistance was determined using a precision abrasion tester of the Fraunhofer Institute IST at Braunschweig and employing for the mensuration of the abrasion rate a modified DIN EN 1071-2-based spherical calotte grinding process. Details of that process are contained in Michler, Surf. & Coat. Tech., Vol. 163-164 (2003), page 547, column 1 and FIG. 1. By reference, said publication becomes an integral part of this patent application.

The following will explain this invention in more detail based on an example and with reference to the attached graphs in which—

FIG. 1 shows XRD spectra of an AlCrN structure with B1 and B4

FIG. 2 shows XRD spectra of AlCrN films as a function of the chemical Al/Cr composition: A=75/25, C=50/50, D=25/75

As indicated in Table 1 and FIG. 1 and stated by Kawate in "Microhardness and lattice parameter of $Cr_{1-x}Al_xN$ films", J. Vac Sci. Technol. A 20(2), March/April 2002; p. 569-571, Al concentrations of greater than 70 At % of the metal content in the film reveal a hexagonal (B4) layer structure while lower Al concentrations display a cubic (B1) layer structure. The HV values measured for hexagonal films were about 2100 $HV_{0.03}$, while the HV values measured for cubic film structures were higher at about 2800-3100 $HV_{0.03}$ (see Table 1). With higher Cr concentrations (sample D) the hardness measured was about 2300 $HV_{0.03}$. In contrast to the AlN lattice of the high-aluminum coatings illustrated in FIG. 2 A, this composition displays a CrN lattice as shown in FIG. 2 D.

Subsequent determinations were aimed at the life of AlCrN-coated 6 mm HSS drill bits used on DIN 1.2080 steel with a hardness of 230 HB at a feed rate of 0.12 mm and a cutting speed of 35 m/min as described in Example 1, below. In the process it was found that, contrary to what JP 09-041127 describes as a particularly suitable AlyCr1-yN range of $1<y\leq 0.7$, a chrome content greater than 0.3 is more advantageous. When the chrome concentration is greater than or equal to 0.8, the performance in this area of application deteriorates again due to the existing CrN lattice. Compared to hexagonal AlCrN films in this test, the life extension of those with a cubic structure was 235%.

For layers in a transitional region with an Al content of between 60% and 75 At % it is possible by way of the process parameters to select not only the privileged orientation but also the basic structure of the crystal lattice. As shown in the example of Test B (Table 2), a low pressure of 1 Pa and a substrate voltage of −50V produced a hexagonal structure, whereas a pressure range of 3 Pa and a substrate voltage of −50V results in a cubic structure. The hexagonal structure is thus deposited at a relatively low bias voltage and low pressure while the preferred cubic structure is deposited at a higher pressure and a relatively higher bias voltage. At higher Al concentrations it is no longer possible to produce a cubic layer structure.

Work pieces according to this invention therefore feature a cubic $(Al_yCr_{1-y})X$ coating of the following composition: X=N or CN but preferably N, and $0.2\leq y<0.7$, preferably $0.40\leq Y\leq 0.68$. The structure of the film in this case is microcrystalline with an average grain size of about 20-120 nm.

Processes according to the invention are characterized by a procedure in which a cubic $(Al_yCr_{1-y})X$ layer is deposited with a composition as defined above. For the cathodic arc process described, target compositions with a 75 to 15% aluminum content lend themselves particularly well. In the case of a high aluminum content the process parameters must be selected as described in order to produce a cubic crystal structure.

In that context it will be advantageous to use powder-metallurgically produced and especially cold-pressed targets that may be more solid than fused or sintered AlCr targets which especially in the case of a high Al content tend to contain brittle phases.

Targets of that type are cold-pressed from mixed pulverulent base materials followed by repeated reshaping for instance in a forging press, compacted at temperatures below 660° C. under fluxing and cold-fusion, and brought to a final condition with a theoretical density of about 96-100%.

It has also been found that in the case of an AlCrN coating that was deposited for instance with targets of the Al/Cr=3 composition, the substrate bias voltage can affect the wear resistance. As the substrate bias voltage is increased, the abrasion resistance decreases (see Table 3). Already with a very small negative substrate voltage, not specifically shown in the Table, of just a few volts (3-10V and any voltage in between) it is possible to obtain a significant improvement in comparison with floating substrates (having no external voltage supply). The wear resistance of Al/Cr=3 reaches its maximum at about −20V, then drops off again at higher voltages. The tests conducted for determining the wear pattern suggest an optimal substrate voltage range of between 3 and 150V and especially between 5 and 40V, in which range a very low abrasion rate of between 0.4 and 1.0 and especially between 0.4 and 0.8 $m^3m^{-1}N^{-1}$ $10^{-15}$ has been measured. Similar conditions apply to cubic layers, per this invention, of different Al/Cr compositions, which did not reveal any abrasion rates of greater than 1.5 $m^3m^{-1}N^{-1}$ $10^{-15}$. It should be mentioned, however, that the wear resistance even of coatings deposited on floating substrates with a high substrate voltage is substantially greater than that of conventional TiAlN coatings whose abrasion coefficient is significantly higher. For example, for a TiAlN film deposited in analogous fashion as the AlCrN coatings (Experiment 2, Al 47 At %, Ti 53 At %) an abrasion rate of 3.47 $m^3m^{-1}N^{-1}$ $10^{-15}$ was measured.

The process described above, and especially the use of powder-metallurgically produced TiAl targets, has made it possible to deposit low-roughness coatings. The HRMS values measured are in the range between 0.1 and 0.2 μm and are thus in the same range as those of CrN coatings produced in comparable fashion. Further smoothing of the coatings has been accomplished using a magnetic field generator encompassing two counter-polarized magnet systems, which generator is so designed that the component $B_1$ of the resulting field, extending in a direction perpendicular to the surface, displays essentially constant small or zero values over a major part of that surface. The values of the perpendicular magnetic field component $B_1$ were set at below 30, preferably below 20 and most desirably below 10 Gauss. The HRMS values of the $(Al_yCr_{1-y})X$ layers thus deposited were in the 0.05 and 0.15 μm range. The magnetic field was generated by two mutually counter-polarized coils coaxially positioned behind the target.

It is also possible when depositing $(Al_yCr_{1-y})X$ coatings to use other, preferably highly conductive, nitride or metallic bonding layers or indeed, for certain applications, to dispense with these. For example, for achieving a particularly high productivity level it is possible to apply an AlCr/AlCrN in lieu of a TiN bonding layer, which allows all arc sources of a coating system to be equipped with AlCr targets and to increase the coating throughput rate.

It is further possible to deposit gradient coatings for instance with an Al content that is incremented toward the surface, either by using two types of targets with different Al/Cr ratios or, starting with a Cr and/or CrN bonding layer, bringing about a progressive change in the layer composition for instance by a continuous or stepwise adjustment of the corresponding target output in a coating chamber equipped with both Cr and AlCr targets. The important factor for an industrial application of this type of coatings is the ability to reproducibly adjust the process parameters essentially over the entire progression of the coating process and thus over the entire thickness of the film. Minor compositional fluctuations occurring for instance on a single- or multiple-rotation substrate carrier can be additionally utilized for producing a nanostructure over part or all of the thickness of the layer, i.e. for lamination in the nano or micrometer range. Due to the process involved in that case, the use of unalloyed chrome and aluminum targets will result in the deposition of a more coarsely structured hard film than would be the case with alloyed AlCr targets.

Not very suitable for this purpose, however, are prior-art processes in which for instance the evaporation of at least one component is either discontinuous or difficult to control, since that does not allow for a reproducible quality of the coating.

It is also possible, of course, to produce this type of coatings in other vacuum coating systems for instance by sputtering, although it may be necessary to compensate for the low ionization of the process gas inherent in sputtering processes by traditional provisions such as special bonding layers, additional ionization etc. in order to obtain comparable bonding of the film.

$Cr_{1-x}Al_xN$ films of this type, having a cubic structure, essentially lend themselves well for coating the most diverse work pieces. Examples include cutting tools such as routers, hobs, spherical, planar and profiling cutters, as well as drills, taps, clearing tools, reamers and indexable inserts for lathes and milling machines or shaping tools such as dies, swages, drawing dies, ejector cores or thread formers. Other examples of advantageous utilization of these protective layers include injection molds for instance for injection-molded metal alloys, synthetic resins or thermoplastics, and especially injection molds as used in the production of plastic components or of data-storage media such as CDs, DVDs and the like. Another application area includes structural components that must meet stringent requirements in terms of wear and perhaps also high oxidation resistance. Examples in the pump and engine industry include sealing washers, pistons, plungers, gears, valve drives, cup rams and rockers, or injection-nozzle valves, compressor shafts, pump spindles, and many denticulated or mortised components.

Given the essentially similar characteristics of $(Al_yCr_{1-y})X$ coatings, they are likely to improve wear resistance when for subsequent layer systems the target composition and coating parameters are selected in such fashion that a cubic layer structure is obtained.

$(Al_yCr_{1-y})X$ films are layers in which X=N, C, B, CN, BN, CBN, NO, CO, BO, CNO, BNO, CBNO, but preferably N or CN and $0.2 \leq y < 0.7$ and preferably $0.40 \leq Y \leq 0.68$.

Accordingly, $(Al_{66}Cr_{33})NO$ layers with different N/O ratios were deposited and their properties tested. The coating parameters selected were similar to those described above. The settings were 1 to 5 Pa for the overall pressure, between 20 and 60 sccm for the oxygen flow (the remainder being nitrogen), between −40 to −150V for the substrate voltage, 450° C. for the temperature and a 140 A3.5 kW current for the source power. The layers produced had O/N ratios of about 0.2, 0.6 and 2.2. Various milling tests showed the coatings with a lower oxygen content to be of superior quality. The results were significantly better than those obtained in lifetime tests with conventional TiN or TiCN.

The fact that these $(Al_yCr_{1-y})X$ films offer better gliding qualities than conventional TiAlN coatings opens up interesting possibilities from both the economic and the ecologic perspectives in connection with the operation of tools, especially cutting and shaping tools by being able to eliminate or to minimize the amount of lubricants needed. With regard to the economic aspects it should be remembered that the cost of cooling lubricants especially in the case of cutting tools can be significantly higher than the cost of the tool itself.

The gliding quality of a coating containing an $(Al_yCr_{1-y})X$ layer per this invention can be further improved by additionally applying an outer slip layer. This slip layer should preferably have a lower hardness value than the $(Al_yCr_{1-y})X$ film and should have good lead-in properties.

The slip layer system may be constituted of at least one metal or of the carbide of at least one metal and dispersed carbon, MeC/C, with the metal being one of group IVb, Vb and/or VIb or silicon. A particularly suitable example with excellent lead-in properties is a WC/C cover layer with a hardness that can be selected between 1000 and 1500 HV. CrC/C layers offer similar characteristics, albeit with a somewhat higher friction coefficient.

Deep-hole drills thus coated, after producing one to three boreholes, displayed an excellent smoothing of the lead-in cutting surfaces, something that has so far been attainable only with a time-consuming mechanical finishing effort. These properties are also of particular interest for application on slide-, friction- or roller-exposed components especially when operated with minimal or no lubrication, or when at the same time an uncoated opposite companion element is to be protected.

Other possibilities for creating outer layers with a slip surface include nonmetallic, diamond-like carbon films or $MoS_x$, $WS_x$ or titanium-containing $MoS_x$ or $MoW_x$ coatings.

In the manner described, the slip layer can be applied directly on the $(Al_yCr_{1-y})X$ film, or on an additional intermediate bonding layer that may be constituted of a metal, a nitride, a carbide, a carbonitride or indeed of a gradient layer for instance with a progressive transition between the $(Al_yCr_{1-y})X$ film and the slip layer for assuring a best possible bond of the composite layer system.

For example, it is possible to produce WC/C or CrC/C layers, after the application of a sputtered or arc-deposited Cr or Ti bonding layer, preferably by sputtering WC targets with the addition of a carbonaceous gas. The proportion of carbonic gas is increased over time so as to obtain a larger free-carbon percentage in the layer.

Illustrated below are examples of other advantageous applications of different $(Al_yCr_{1-y})X$ hard-coated tools used in a variety of cutting operations.

EXAMPLE #1

Milling of Structural Steel

The tool: Hard-metal end-milling cutter

Diameter D=8 mm, number of teeth z=3

Material: Structural steel Ck45, DIN 1.1191

Milling parameters:

Cutting speed $v_f$=200/400 m/min

Feed rate $v_z$=2388/4776 mm/min

Radial width of contact $a_e$=0.5 mm

Axial width of contact $a_p$=10 mm

Cooling: 5% emulsion

Process: Climb milling

Abrasion criterion: Flank wear VB=0.12 mm

| Experiment | Metal content (At %) Layer | | | Life span t at VB = 0.12 mm In minutes | |
|---|---|---|---|---|---|
| No. | Ti | Al | Cr | $v_c$ = 200 m/min | $v_c$ = 400 m/min |
| 1 (TiCN) | 100 | — | — | 71 | 9 |
| 2 (TiAlN) | 53 | 47 | — | 42 | 15 |
| 3 (AlCrN) B1 | — | 69.5 | 30.5 | 167 | 40 |
| 4 (AlCrN) B4 | — | 72 | 28 | 41 | 7 |
| 5 (AlCrN) B1 | — | 41.5 | 58.5 | 150 | 12 |
| 6 (AlCrN) B1 | — | 19 | 81 | 17 | 4 |

Example #1 shows a comparison of the life span of coated HM milling tools tested with different cutting parameters.

It is clearly evident that, compared to conventional industrially employed coatings such as TiCN and TiAlN, the AlCrN described offer longer life spans. The results also show that, as in Example #1, the tool life is extended with an augmented Al content, provided the cubic B1 structure is maintained (compare Experiment No. 3, 5, 6). This is attributable primarily to improved oxidation resistance and hardness as the Al content is augmented (see Table 1). It is especially in dry and high-speed processing (e.g. $v_c$=400 m/min) that this excellent oxidation resistance of the AlCrN coating proves advantageous. Apart from that, it is noted in this test as well that a shearing of the crystal lattice from the B1 to the B4 structure causes the wear resistance to deteriorate (compare Experiments 3 and 4).

EXAMPLE #2

Milling Austenitic Steel

The tool: Hard-metal end-milling cutter

Diameter D=8 mm, number of teeth z=3

Material: Austenitic steel X 6 CrNiMoTi 17 12 2, DIN 1.4571

Milling parameters:

Cutting speed $v_c$=240 m/min

Tooth feed rate $f_z$=0.08 mm

Radial width of contact $a_e$=0.5 mm

Axial width of contact $a_p$=10 mm

Cooling: 5% emulsion

Process: Climb milling

Abrasion criterion: Flank wear VB=0.1 mm

| Experiment No. | Metal content (At %) Layer | | | Tool life travel $I_f$ at VB = 0.1 mm in meters |
| --- | --- | --- | --- | --- |
|  | Ti | Al | Cr |  |
| 7 (TiCN) | 100 | — | — | 33 |
| 8 (AlTiN) | 35 | 65 | — | 45 |
| 9 (AlCrN) B1 | — | 69.5 | 30.5 | 54 |

Example #2 shows a comparison of the life span of coated HM milling tools. Here as well, the AlCrN layer resulted in improved wear resistance compared to the hard films currently used in the industry. The extended life span through the use of AlCrN was obtained due, for one, to an as yet undocumented lower propensity for streaking—compared to Ti in TiAlN layers—of Cr as the second element of the alloy, and, for another, to the good wear resistance, shown in Table 1, of the AlCrN films (A, B, D) of this invention, while at the same time offering high hardness values.

EXAMPLE #3

Milling Hardened Steel

The tool: Hard-metal ball-head milling tool

Diameter D=10 mm, number of teeth z=2

Material: K340 (62HRC), corresponds to C 1.1%, Si 0.9%, Mn 0.4%, Cr 8.3%, Mo 2.1%, V 0.5%

Milling parameters:

Cutting speed $v_c$=0-120 m/min

Tooth feed rate $f_z$=0.1 mm

Radial width of contact $a_e$=0.2 mm

Axial width of contact $a_p$=0.2 mm

Cooling: Dry

Process: Climb and upcut milling, finishing

Abrasion criterion: Flank wear VB=0.3 mm

| Experiment No. | Metal content (At %) Layer | | | Tool life travel $I_f$ at VB = 0.3 mm in meters |
| --- | --- | --- | --- | --- |
|  | Ti | Al | Cr |  |
| 10 (TiAlN) | 53 | 47 | — | 70 |
| 11 (AlCrN) B1 | — | 69.5 | 30.5 | 90 |
| 12 (AlTiN) | 35 | 657 | — | 90 |
| 13 (AlCrN) B1 | — | 69.5 | 30.5 | 130 |

Examples #3 and #4 show an improved tool life travel of the AlCrN films as compared to TiAlN coatings currently used in the industry. AlCrN thus also lends itself particularly well to dry machining that involves demanding requirements in terms of oxidation and wear resistance.

EXAMPLE #4

Rough-Milling of Tool Steel

The tool: Hard-metal end-milling cutter

Diameter D=10 mm, number of teeth z=4

Material: Tool steel X 38 CrMoV 5 1, DIN 1.2343 (50HRC)

Milling parameters:

Cutting speed $v_c$=60 m/min

Tooth feed rate $f_z$=0.02 mm

Radial width of contact $a_e$=2 mm

Axial width of contact $a_p$=10 mm

Cooling: Dry

Process: Climb milling, roughing

Abrasion criterion: Flank wear VB=0.1 mm

EXAMPLE #5

Drilling Tool Steel

The tool: HSS drill (S 6-5-2). Diameter D=6 mm

Material: Tool steel X 210 Cr 12, DIN 1.2080 (230HB)

Drilling parameters:

Cutting speed $v_c$=35 m/min

Feed rate f=0.12 mm

Depth of bore z=15 mm, pocket hole

Cooling: 5% emulsion

Abrasion criterion: Torque cutoff (corresponds to a corner abrasion of $\geq 0.3$ mm)

| Experiment No. | Metal content (At %) Layer | | Tool life travel [number of holes/μm layer thickness] |
|---|---|---|---|
| | Al | Cr | |
| 14 (AlCrN) B1 | 19 | 81 | 21 |
| 15 (AlCrN) B1 | 41.5 | 58.5 | 52 |
| 16 (AlCrCN) B1 | 41.5 | 58.5 | 65 |
| 17 (AlCrN) B1 | 69.5 | 30.5 | 108 |
| 18 (AlCrN) B4 | 72 | 28 | 46 |

Example #6 shows a comparison of HSS drills with $Al_yCr_{1-y}N/Al_yCr_{1-y}CN$ layers having different Al concentrations, with the number of holes standardized over the layer thickness.

The layers were produced along the parameters per Table 2. As can be seen, the life span is extended as the aluminum content is increased, up to an aluminum concentration of just under 70% of the overall metal content. Any further increase, however, leads to the deposition of a layer with a hexagonal crystal structure and thus to a distinct drop in performance. A performance significantly better than that attainable by prior-art methods (Experiment #18) manifested itself in the range between 41.5% and 69.5% (Experiments #15, 17).

EXAMPLE #6

Deep-Hole Drilling 5xD in Ck45

The tool: Hard-metal drill. Diameter D=6.8 mm

Material: Structural steel 1.1191 (Ck45)

Drilling parameters:

Cutting speed $v_c$=120 m/min

Feed rate f=0.2 mm

Depth of bore z=34 mm, pocket hole

Cooling: 5% emulsion

Abrasion criterion: Corner abrasion VB=0.3 mm)

| Experiment No. | Metal content (At %) Layer | | | Tool life span t at VB = 0.3 mm in Number of boreholes |
|---|---|---|---|---|
| | Ti | Al | Cr | |
| 18 (TiAlN) | 70 | 30 | — | 890 |
| 19 (TiAlN) | 53 | 47 | — | 1135 |
| 20 (AlCrN) B1 | — | 69.5 | 30.5 | 2128 |

Example #6 shows an improved tool life travel with the AlCrN layer as compared to TiAlN films currently used for drilling purposes in the industry. In this case the enhanced abrasive wear resistance of the AlCrN coating per this invention has proved valuable.

In addition, drill bits when coated as in Experiment #20 and after the application of a Cr bonding layer, were provided with a WC/carbon slip layer, which, with all other test conditions being identical, resulted in a significantly extended tool life. Simultaneously performed torque measurements revealed a substantially lower torque than encountered without a slip layer. Moreover, the bores displayed an improved surface quality and, until just before the end of the tool life, no discoloration due to an excessive thermal load was detectable.

EXAMPLE #7

Tapping 2xD in Austenitic Steel

The tool: HSS tap for thread size M8

Material: Austenitic steel 1.4571 (X6CrNiMoT117/12/2)

Cutting parameters:

Cutting speed $v_c$=3 m/min

Depth of thread: 2XD

Type of thread: Pocket hole

Number of threads: 64

Cooling: 5% emulsion

Abrasion criterion: Torque pattern over the number of threads, visual inspection of wear after 64 threads.

| Experiment No. | Metal content (At %) Layer | | | Max. Dia. Cutting torque [Nm] | Visual wear (1) |
|---|---|---|---|---|---|
| | Ti | Al | Cr | | |
| 21 (TiCN) | 100 | — | — | 4.72 | + |
| 22 (AlCrN) B1 | — | 69.5 | 30.5 | 4.05 | ++ |
| 23 (AlCrN) B1 | — | 41.5 | 58.5 | 4.23 | +++ |
| 24 (AlCrN) B1 | — | 19 | 81 | 4.27 | + |

Explanation of (1)
+ satisfactory wear pattern in screw tapping
++ good wear pattern in screw tapping
+++ very good wear pattern in screw tapping Compared to prior art (TiCN), all AlCrN films make it possible to reduce the mean maximum cutting torque. Moreover, the very good wear resistance of the layers with a higher aluminum content results in an improved wear pattern compared to TiCN. On the other hand, this example shows that, presumably due to the adhesive tendency of aluminum that leads to material streaking and ultimately to peeling, the coating per Experiment #23 offers a better wear pattern than that of #22.

In addition, taps when coated as in Experiments #22 and #23 and after the application of an AlCr bonding layer, were provided with a WC/carbon slip layer, or, after the application of a Ti bonding layer, with a Ti-containing $MoS_2$ layer, which again, with all other test conditions being equal, resulted in an extended tool life and a qualitatively better surface finish of the work piece.

EXAMPLE #8

Hob-Milling of Cr—Mo Steel

The tool: Hob cutter

Material: DIN S6-7-7-10 (ASP60)

Diameter D=80 mm, length L=240 mm, module m=1.5

25 chip grooves

Angle of pressure α=20°

Basic rack tooth profile: 2, number of teeth: 50, pitch: 25 mm

Material: Cr—Mo steel DIN 34CrMo4

Cutting parameters:

Cutting speed $v_c$=260 m/min

Feed rate=2 mm/rev

Quantity: 300

Cooling: Dry cut, compressed air for chip removal

| Experiment | Metal content (At %) Layer | | | Wear of cutting edge in [mm] | |
|---|---|---|---|---|---|
| No. | Ti | Al | Cr | Flank wear | Crater wear |
| 25 (TiCN) | 100 | — | — | 0.32 | 0.062 |
| 26 (TiAlN) | 53 | 47 | — | 0.25 | 0.042 |
| 27 (AlCrN) B4 | | 72 | 28 | 0.29 | 0.053 |
| 28 (AlCrN) B1 | — | 19 | 81 | 0.26 | 0.051 |
| 29 (AlCrN) B1 | — | 41.5 | 58.5 | 0.13 | 0.022 |
| 30 (AlCrN) B1 | — | 69.5 | 30.5 | 0.14 | 0.018 |

The Experiments 25 to 30 involved the dry-cut testing of different hob cutters of powder-metallurgically produced high-speed steel (HSS) provided with different coatings. The tools coated with films according to this invention (Experiments 29 and 30) offer significantly improved performance compared to hobbers coated with traditional TiCN or TiAlN films. It can also be seen that AlCrN layers with a low (#28) or, in the presence of a hexagonal crystal structure (#27), excessively high Al content provide diminished wear protection.

The following Examples No. 31 through 33 again show the clearly superior characteristics of an AlCrN layer according to this invention, with a cubic crystal lattice, an essentially stoichiometric nitrogen percentage and an Al content of 66%. In this case, hob cutters produced from PM HSS and, respectively, hard metal were tested both under dry-cutting and emulsion-lubricated cutting conditions.

Experiment #31

Hob Cutting

The tool: PM HSS

Diameter D=80 mm, length L=240 mm

Material: 16 Mn Cr S

Cutting speed: 180 m/min., dry $(Al_{0.42}Ti_{0.58})N$, Balinite NANO: Quantity 1,809

$(Al_{0.63}Ti_{0.37})N$, Balinite X.CEED: Quantity 2,985

$(Al_{0.00}Cr_{0.34})N$: Quantity 5,370

Experiment #32

Hob Cutting

The tool: Hard metal (HM)

Diameter D=60 mm, length L=245 mm

Module: 1.5

Pressure angle_=20°

Material: 42 CrMo4

Cutting speed: 350 m/min, dry $(Al_{0.41}Ti_{0.59})N$, Balinite X.TREME: Quantity 1,722

$(Al_{0.63}Ti_{0.37})N$, Balinite X.CEED: Quantity 2,791

$(Al_{0.66}Cr_{0.34})N$: Quantity >3,400

Experiment #33

Hob Cutting

The tool: PM HSS

Module 2.5

Material: 16MnCrS

Cutting speed: 140 m/min, emulsion

TiCN, BALINITE B: Quantity 1,406

$(Al_{0.43}Ti_{0.58})N$, Balinite NANO: Quantity 1,331

$(Al_{0.66}Cr_{0.34})N$: Quantity 1,969

Additional tests, not described here in any detail, yielded good stability even in higher cutting speed ranges as high as $v_c$=450 m/min. Similarly, the life span of coated hard-metal hob cutters was extended quite significantly in wet-cutting but especially also in dry processing operations.

EXAMPLE #9

Rough Milling of Tool Steel

The tool: HSS end milling cutter

Diameter D=10 mm, number of teeth z=4

Material: Tool steel X 40 CrMoV 5 1, DIN 1.2344 (36HRC)

Milling parameters:

Cutting speed $v_c$=60 m/min

Tooth feed $f_z$=0.05 mm

Radial width of contact $a_e$=3 mm

Axial width of contact $a_p$=5 mm

Cooling: 5% emulsion

Process: Climb milling, roughing

Abrasion criterion: Flank wear VB=0.1 mm

| Experiment | Metal content (At %) Layer | | | Tool life travel $I_f$ at VB = 0.1 mm in |
|---|---|---|---|---|
| No. | Ti | Al | Cr | meters |
| 34 (AlTi) N | 35 | 65 | — | 6-8 |
| 35 (AlTi) N | 58 | 42 | — | 3-4 |
| 36 (AlTi) CN | 50 | 50 | — | 3-4 |
| 37 TiCN | 100 | — | — | 8-11 |
| 38 (AlCr) N | BL | 66 | 36 | 12-21 |
| 39 (AlCr) N | Pulsed | 66 | 36 | 21-28 |
| 40 (AlCr) N | — | 66 | 36 | 12-18 |

BL = bonding layer of TiN
Pulsed = pulsed bias

EXAMPLE #10

Longitudinal Turning of Outer Diameter on Case Hardened Steel

The tool: Lathe cutter with brazed-in CBN insert

Material: Case-hardened steel 16 MnCr 5, DIN 1.7131(49-62 HRC)

Lathe-turning parameters: Carbide- and mild-steel machining with multi-step cutting and partly reduced wall thickness Cooling: Dry Abrasion criterion: Quantities up to where a flank wear of VB=0.1 mm is reached.

| Experiment | Metal content (At %) Layer | | | Tool life quantity |
|---|---|---|---|---|
| No. | Ti | Al | Cr | at VB = 0.1 mm |
| 41 (AlTi) N | 35 | 65 | — | 90 |
| 42 (AlCr) N | — | 66 | 36 | 144 |

Similar results were achieved with powder-metallurgically produced cermets consisting of a TiN, TiC or Ti(CN) hard phase to which in a few individual cases molybdenum and/or tantalum was added. The binder phase used in that process was Ni or Ni/Co.

EXAMPLE #11

Forming Threads in Galvanized Plate Metal

Experiment #43:

The tool: HSS M9 thread former

Material: DC01, corresponding to DIN 1.0330, St 12 ZE

Core hole diameter: 8.34 mm

Cutting parameters: 55 m/s

Rotary cutting speed: 2000 RPM

Reverse cutting speed: 3600 RPM

Lubrication: S26 CA

TiN: 3200 threads

TiCN: 3200 threads

TiAlN: 3500 threads $(Al_{0.66}Cr_{0.34})N$: 8800 threads

Tests with coated CBN (cubic boronitride) and cermet tools: Indexable inserts consisting of different CBN sintered materials with a CBN content of between 30 and 99 percent by volume, the remainder being binders, were coated, on the one hand, with conventional TiAlN layers as per Experiment #8, and on the other hand with AlCrN layers according to this invention and as shown in Experiments 3, 5 and 6. For the etching and coating process, however, because of the nonconductive nature of the CBN sintered material, a pulsed substrate bias was applied in the medium frequency range and by preference in a frequency range from 20 to 250 kHz.

For materials with a CBN content of up to 90% a pulverulent binder was used that consisted of at least one of the elements of the following group: The nitride, carbide, boride and oxide of the Ti, V or Cr group, i.e. IVa, Va and VIa elements as well as aluminum or Al alloys.

For materials with a CBN content of up to 95% a pulverulent binder was used that consisted of titanium nitride and at least one of the elements of the following group: Cobalt, nickel, tungsten carbide, aluminum or an aluminum alloy.

For materials with a CBN content higher than 90%, use was also made of a pulverulent binder consisting of titanium nitride and at least one of the elements of the following group: Boride or boronitride of the alkaline or alkaline-earth metals.

Most of the subsequent turning and milling tests revealed a significantly better wear resistance than that of TiAlN coatings. The same was found in a particularly laborious longitudinal outer-diameter turning test that involved the machining, in part by discontinuous stepwise cutting, of an only partially hardened shaft with a complex geometric configuration.

What is claimed is:

1. Work piece coated with a system of film layers comprising at least one film composed of $(Al_yCr_{1-y})X$, where X=N, C, B, CN, BN, CBN, NO, CO, BO, CNO, BNO or CBNO and $0.415 \leq y \leq 0.695$, with the composition within said $(Al_yCr_{1-y})X$ film varying over the thickness of the $(Al_yCr_{1-y})X$ film continually or in steps, said $(Al_yCr_{1-y})X$ film having a cubic crystal structure and a rate of wear less than or equal to $1.5 \times 10^{-15}$ $m^3 m^{-1} N^{-1}$, said work piece constituting one of the following tools: a milling tool, a clearing tool, an (indexable tip) insert for turning and milling.

2. Work piece as in claim 1, wherein the tool is a forming tool of an upper die, a bottom swage, an ejector core or a thread former.

3. Work piece as in claim 1, wherein the tool is an injection-molding tool for producing a molded plastic part or a data storage medium.

4. Work piece as in claim 1, wherein the tool is a CBN or Cermet tool or that the tool is a CBN or Cermet (indexable tip) insert.

5. Work piece as in claim 1, wherein a Vickers pyramid hardness of the $(Al_yCr_{1-y})X$ film is 2300 to 3100.

6. Work piece as in claim 1, wherein a layer structure of the $(Al_yCr_{1-y})X$ film is microcrystalline with an average grain size of 20 to 120 nm.

7. Work piece as in claim 1, wherein a bonding layer is applied between the work piece and the $(Al_yCr_{1-y})X$ film.

8. Work piece as in claim 7, wherein said bonding layer encompasses at least one of the metals of group IV, V or subgroup VI, or aluminum.

9. Work piece as in claim 7, wherein said bonding layer includes at least one nitride, carbide or carbonitride of one or several metals of subgroup IV, V or VI.

10. Work piece as in claim 7, wherein at least one $(Al_yCr_{1-y})X$ film is additionally coated with a slip layer.

11. Work piece as in claim 10, wherein said slip layer encompasses a carbide of at least one metal with dispersed carbon, Me/C wherein Me is a metal selected from among group IVb, Vb and VIb metals and silicon, a diamond-like carbon layer, a Si- or metallic diamond-like carbon layer, $MoS_x$, a $WS_x$ or a titanium-containing $MoS_x$ or $MoW_x$ layer.

12. Process comprising the steps of machining a material with a tool recited in claim 1, wherein said machining using said tool is performed without the addition of lubricants or cooling agents.

13. Process as in claim 12, wherein the tool is a hard-metal or HSS hob (cutter) and the cutting speed is 60 to 450 m/min.

14. Process as in claim 12, wherein the tool is an end-milling, (spherical-head) ball-nose-mill or a roughing cutter.

15. Work piece as in claim 1, wherein the milling tool is a hob, or a (spherical-head) ball nose mill.

16. Work piece as in claim 1, wherein the clearing tool is a planar or profiling cutter, or a reamer.

17. Work piece as in claim 1, wherein the tool is a forming tool of a drawing die.

* * * * *

UNITED STATES PATENT AND TRADEMARK OFFICE
CERTIFICATE OF CORRECTION

| | | |
|---|---|---|
| PATENT NO. | : 7,851,075 B2 | Page 1 of 1 |
| APPLICATION NO. | : 11/749236 | |
| DATED | : December 14, 2010 | |
| INVENTOR(S) | : Volker Derflinger et al. | |

It is certified that error appears in the above-identified patent and that said Letters Patent is hereby corrected as shown below:

In the specification, column 1, line 20, replace "AlCRCN" with -- AlCrCN --

In the specification, column 9, line 34, replace "D-6.8 mm" with -- D=6.8 mm --

In the specification, column 10, line 10, replace "(X6CrNiMoT117/12/2)" with
-- (X6CrNiMoTi17/12/2) --

In the claims, column 14, line 46, replace "Me/C" with -- MeC/C --

In the claims, column 14, line 49, insert the word -- a -- at the beginning of the line before the word "MoSx"

Signed and Sealed this
Twenty-sixth Day of April, 2011

David J. Kappos
*Director of the United States Patent and Trademark Office*